(12) United States Patent
Huang (10) Patent No.: US 7,170,946 B2
(45) Date of Patent: Jan. 30, 2007

(54) SYSTEM AND METHOD FOR REVIVING CATASTROPHIC CODES

(75) Inventor: Dawei Huang, Brisbane (AU)

(73) Assignee: Lucent Technologies Inc., Murray Hill, NJ (US)

( * ) Notice: Subject to any disclaimer, the term of this patent is extended or adjusted under 35 U.S.C. 154(b) by 785 days.

(21) Appl. No.: 10/090,237

(22) Filed: Mar. 4, 2002

(65) Prior Publication Data

US 2003/0165199 A1 Sep. 4, 2003

(51) Int. Cl.
*H04L 23/02* (2006.01)

(52) U.S. Cl. ...................................... 375/265; 714/792

(58) Field of Classification Search ................ 375/260, 375/262, 265, 285, 341; 714/786, 792, 795, 714/774–775, 779, 787
See application file for complete search history.

(56) References Cited

U.S. PATENT DOCUMENTS

| 4,208,739 A | 6/1980 | Lu et al. ........................ 375/2 |
| 4,389,636 A | 6/1983 | Riddle, Jr. ........... 340/347 DD |
| 4,757,506 A | 7/1988 | Heichler ...................... 371/43 |
| 5,257,272 A | 10/1993 | Fredrickson ................ 371/43 |
| 5,430,744 A | 7/1995 | Fettweis et al. ............. 371/43 |
| 5,436,918 A * | 7/1995 | Kato et al. .................. 714/795 |
| 5,488,633 A | 1/1996 | Laroia ........................ 375/262 |
| 5,548,600 A | 8/1996 | Fredrickson et al. .......... 371/43 |
| 5,592,517 A * | 1/1997 | Camp et al. ................. 375/350 |
| 5,675,590 A * | 10/1997 | Alamouti .................... 714/786 |
| 5,706,312 A | 1/1998 | Wei ............................. 375/298 |
| 5,812,602 A * | 9/1998 | Humblet ..................... 714/792 |
| 5,907,565 A * | 5/1999 | Alamouti .................... 714/792 |
| 5,931,965 A | 8/1999 | Alamouti .................... 714/792 |
| 6,088,390 A * | 7/2000 | Russell et al. .............. 375/233 |
| 6,108,374 A | 8/2000 | Balachandran et al. ..... 375/227 |
| 6,122,120 A * | 9/2000 | Shimoda ...................... 360/46 |
| 6,170,076 B1 | 1/2001 | Kim ............................ 714/786 |
| 6,215,827 B1 | 4/2001 | Balachandran et al. ..... 375/262 |
| 6,347,122 B1 | 2/2002 | Chen et al. ................. 375/262 |
| 6,634,009 B1 * | 10/2003 | Molson et al. ................. 716/1 |
| 2001/0033578 A1 | 10/2001 | Rodriguez et al. .......... 370/442 |

OTHER PUBLICATIONS

Forney, Jr., "*Modulation and Coding for Linear Gaussian Channels*," IEEE Transactions on Information Theory, vol. 44, No. 6, Oct. 1998, pp. 2384-2415.

* cited by examiner

*Primary Examiner*—Khanh Tran (57) ABSTRACT

A system and method of the present invention revives a catastrophic code used for channel coding data. A data receiving circuit receives a digital input data sequence to be coded with a code having a distance spectrum containing an infinite component that corresponds to a finite hamming weight such that the code may cause catastrophic error propagation. The circuit is operative for periodically inserting known symbols into the digital input data sequence. An encoder, such as a convolutional encoder, is operatively connected to the data receiving circuit and encodes the digital input data sequence.

23 Claims, 7 Drawing Sheets

FIG. 1A

Transfer between states

Thus, let $a_{2^m-1} = D^{k_{1,2^m-1}}$ but $$a_j = \left[ D^{k_{2j,j}}, D^{k_{2j+1,j}} \right], j \neq 2^{m-1},$$

as a result:

$$S_t = \begin{bmatrix} S_{t,1} \\ \vdots \\ S_{t,2^m-1} \end{bmatrix} = TS_{t-1}, \qquad S_0 = \begin{bmatrix} 0 \\ \vdots \\ 0 \\ D^{k_{0,2^m-1}} \\ 0 \\ \vdots \\ 0 \end{bmatrix},$$

where $$T = \begin{bmatrix} 0 & a_1 & 0 & \cdots & 0 \\ 0 & 0 & a_2 & \cdots & 0 \\ \cdot & \cdot & \cdot & \cdots & \cdot \\ 0 & 0 & 0 & \cdots & a_{2^{m-1}-1} \\ a_{2^{m-1}} & 0 & 0 & \cdots & 0 \\ 0 & a_{2^{m-1}+1} & 0 & \cdots & 0 \\ 0 & 0 & a_{2^{m-1}+2} & \cdots & 0 \\ \cdot & \cdot & \cdot & \cdots & \cdot \\ 0 & 0 & 0 & \cdots & a_{2^m-1} \end{bmatrix}.$$

Now, let $$\vec{\xi} = \sum_{t=0}^{\infty} S_t, \qquad (1)$$

then $$\vec{\xi} = \sum_{t=0}^{\infty} T^t S_0 = (I - T)^{-1} S_0.$$

FIG. 3

$$s_{t,0} = D^{k_{1,0}} s_{t-1,1}, \text{let}$$

$$\xi_0 = \sum_{t=0}^{\infty} s_{t,0} = \begin{bmatrix} D^{k_{1,0}} & 0 & \ldots & 0 \end{bmatrix} \vec{\xi}$$

$$= \begin{bmatrix} D^{k_{1,0}} & 0 & \ldots & 0 \end{bmatrix} (I - T)^{-1} S_0. \quad (2)$$

FIG. 4

$$T_0 = \begin{bmatrix} 0 & a_1 & 0 & \cdots & 0 \\ 0 & 0 & a_2 & \cdots & 0 \\ \cdot & \cdot & \cdot & \cdots & \cdot \\ 0 & 0 & 0 & \cdots & a_{2^m-1-1} \\ 0 & 0 & 0 & \cdots & 0 \\ \cdot & \cdot & \cdot & \cdots & \cdot \\ 0 & 0 & 0 & \cdots & 0 \end{bmatrix},$$

we have
$$S_t = T_0 S_{t-1}.$$

Assume that the zero is inserted at the $j_0 - th$ position after the error one happens. Then $$S_{nK+j} = \begin{cases} T^j S_{nK}, & 0 \le j < j_0 \\ T^{j-j_0} T_0 T^{j_0-1} S_{nK}, & j_0 \le j < K. \end{cases}$$

Now, let
$$P = I + \ldots + T^{j_0-1} + T_0 T^{j_0-1}$$
$$+ \ldots + T^{K-j_0} T_0 T^{j_0-1},$$
$$T_K = T^{K-j_0} T_0 T^{j_0-1},$$

we have
$$S_{nK} = T_K S_{(n-1)K},$$

$$\vec{\xi} = \sum_{n=0}^{\infty} \sum_{j=0}^{K-1} S_{nK+j} = \sum_{n=0}^{\infty} P S_{nK}$$

$$= P \sum_{n=0}^{\infty} T_K^n S_0 = P (I - T_K)^{-1} S_0$$

FIG. 5

$$T = \begin{bmatrix} 0 & D & D \\ 1 & 0 & 0 \\ 0 & D & D \end{bmatrix}$$

as a result:

$$[D^2, 0, 0] \, (I - T)^{-1} \begin{bmatrix} 0 \\ D^2 \\ 0 \end{bmatrix}$$

$$= \frac{\begin{vmatrix} 0 & -D & -D \\ 1 & 1 & 0 \\ 0 & -D & 1-D \end{vmatrix}}{\begin{vmatrix} 1 & -D & -D \\ -1 & 1 & 0 \\ 0 & -D & 1-D \end{vmatrix}} D^4$$

$$= \frac{D^5}{1 - 2D}.$$

FIG. 6

$$P = \begin{bmatrix} 1 & D & D \\ 0 & 1+D & D \\ 0 & 0 & 1 \end{bmatrix},$$

$$T_K = \begin{bmatrix} 0 & D^2 & D^2 \\ 0 & 0 & 0 \\ 0 & D^2 & D^2 \end{bmatrix},$$

$$\xi_0 = [1, D, D] \begin{bmatrix} 1 & -D^2 & -D^2 \\ 0 & 1 & 0 \\ 0 & -D^2 & 1-D^2 \end{bmatrix}^{-1} \begin{bmatrix} 0 \\ 1 \\ 0 \end{bmatrix} D^4$$

$$= \frac{\begin{vmatrix} 1 & -D^2 & -D^2 \\ 1 & D & D \\ 0 & -D^2 & 1-D^2 \end{vmatrix}}{\begin{vmatrix} 1 & -D^2 & -D^2 \\ 0 & 1 & 0 \\ 0 & -D^2 & 1-D^2 \end{vmatrix}} D^4$$

$$= \frac{D^5}{1-D} = D^5 \sum_{k=0}^{\infty} D^k.$$

FIG. 7

$$P = \begin{bmatrix} 1+D & D+D^2 & D+D^2 \\ 1 & 1 & 0 \\ 0 & D & 1+D \end{bmatrix},$$

$$T_K = \begin{bmatrix} 0 & 0 & 0 \\ D & D^2 & D^2 \\ 0 & 0 & 0 \end{bmatrix},$$

$$\xi_0 = [1, D, D] \times \begin{bmatrix} 1 & 0 & 0 \\ -D & 1-D^2 & -D^2 \\ 0 & 0 & 1 \end{bmatrix}^{-1} \begin{bmatrix} 0 \\ 1 \\ 0 \end{bmatrix} (1+D)D^4$$

$$= \frac{\begin{vmatrix} 1 & 0 & 0 \\ 1 & D & D \\ 0 & 0 & 1 \end{vmatrix} (1+D)D^4}{\begin{vmatrix} 1 & 0 & 0 \\ -D & 1-D^2 & -D^2 \\ 0 & 0 & 1 \end{vmatrix}}$$

$$= \frac{D^5}{1-D} = D^5 \sum_{k=0}^{\infty} D^k.$$

SYSTEM AND METHOD FOR REVIVING CATASTROPHIC CODES

FIELD OF THE INVENTION

This invention relates to channel coding, and more particularly, this invention relates to channel coding using revived catastrophic codes.

BACKGROUND OF THE INVENTION

It is well known that digital data transmitted over a communications channels is subject to signal impairments created by noise, distortion and fading, creating transmission errors. These types of errors can also occur when digital data is stored on devices, including magnetic media or solid-state memories that contain imperfections. This noise is critical in wireless communications where the noise can be extensive and the amount of power used in communication is limited. Typically, the noisy channel is characterized by the signal-to-noise ratio (SNR), which is a ratio of the signal energy over the noise energy in decibels. It is also possible to take the difference in transmission rates into account and define the SNR per bit when the efficiency of codes is compared with different code rates.

It is known that introducing a controlled amount of redundancy by coding in a selected message before a transmission over a communications channel corrects possible errors due to noise, as noted by Dr. Claude Shannon. In a noisy channel, the transmission rate is reduced to obtain accuracy. A limit, called the Shannon limit, shows the upper bound of the transmission rate for lossless communications in a noisy channel.

Block codes were first used in communications, but these block codes were not efficient when comparing to the Shannon limit. More efficient channel codes have been developed on the basis of trellis coding. A trellis encoder includes a Finite State Machine (FSM) and typically a signal mapper. The trellis is generated by the FSM, while code words are binary sequences that are one-to-one mappings of all distinct paths on the trellis by the signal mapper. When a special input sequence is transmitted, the path corresponding to this input sequence is found on the trellis, and the code word generated by the signal mapper. On the decoding side, a maximum likelihood (ML) decoder as a Viterbi decoder or a Maximum a Posteriori (MAP) decoder converts the received code words into the input sequence.

One important parameter of the Finite State Machine is the memory length m that decides the trellis. The most widely used trellis codes include convolutional codes and turbo codes, as noted in many teachings, including the IEEE technical paper entitled, "Modulation Encoding For Linear Gaussian Channels," IEEE Transactions on Information Theory, Volume 44, No. 6, October 1998, the disclosure which is hereby incorporated by reference in its entirety.

Other examples of trellis coding, the use of convolutional codes, and convolutional encoders are disclosed in U.S. Pat. Nos. 5,706,312; 6,108,374; 6,215,827 assigned to Lucent Technologies; and 6,347,122 assigned to Agere Systems, the disclosures which are hereby incorporated by reference in their entirety.

Among the different convolutional codes, it is known that some exhibit a characteristic behavior known as catastrophic error propagation. In other words, in catastrophic codes, a finite sequence of errors in the receive signal sequence could result in an infinite sequence of decoding errors. This happens when there is a sequence of input such that the corresponding state sequence starts and ends at the same state while the output code sequence consists of all zeros. An example is the input sequence which consists of all ones, while generator polynomials have an even number of ones. Thus, many signal errors in transmission could occur with this type of coding.

SUMMARY OF THE INVENTION

The present invention is advantageous and revives catastrophic codes by inserting known symbols, such as zeros, into the information sequence on a periodic basis. The present invention obtains some good codes, which perform even better than ordinary non-catastrophic codes. It is also possible to calculate the transfer function from both ordinary and zero-inserted convolutional codes.

In accordance with the present invention, a system for reviving a code used for channel coding in data communication systems comprises a data receiving circuit that receives a digital input data sequence to be coded with a code having a distance spectrum containing an infinite component that corresponds to a finite hamming weight, such that the code may cause catastrophic error propagation. The circuit is operative for periodically inserting known symbols into the digital input data sequence. An encoder is operatively connected to the data receiving circuit for encoding the digital input data sequence with the code.

In one aspect of the present invention, the known symbols that are inserted comprise zeros. A convolutional encoder encodes the expanded digital data sequence to produce a channel coded data stream. Then the number of connections between the corresponding trellis nodes are reduced. The trellis corresponds to a memory length m, and the known symbols are inserted after each m symbol within the input data sequence.

A method of reviving a code used for channel coding data in a data communication system is disclosed. The method comprises the step of receiving a digital input data sequence to be coded with a code having a distance spectrum containing an infinite component that corresponds to a finite hamming weight, such that the code may cause catastrophic error propagation. Known symbols are periodically inserted into the digital input data sequence. The digital input data sequence is encoded with a code.

In yet another aspect of the present invention, the known symbols comprise zeros that can be inserted after two or four information bits within the digital input data sequence as a non-limiting example. The code comprises a convolutional code that could be a time varying convolutional code or a time invariant convolutional code, such that a corresponding state diagram contains a circuit in which a non-zero input sequence corresponds to an all-zero output sequence, or convolutional codes with feedback.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously overcomes the drawbacks of using some channel codes, such as convolutional codes because of the catastrophic nature of some of the codes. The present invention now permits many catastrophic codes to be revived by periodically inserting known symbols, such as zeros, into the data information sequence. Through the system and method of the present invention, some good codes can be obtained, which perform even better than ordinary non-catastrophic codes. A new definition of what is a catastrophic code with respect to the distance spectrum is provided, which is specially suitable for the time varying convolutional code. The present invention also provides for a system and method to calculate the path enumerator for both ordinary and zero-inserted convolutional codes, such as with trellis coded modulation.

As is known to those skilled in the art, trellis coded modulation is a combined method for joint coding and modulation based on the design of convolutional codes. These are matched to a modulation signal, which is established to maximize the Euclidian distance between a modulated sequence. A trellis diagram is a graph that represents the changes over time of a Finite State Machine by defining the states as vertices. Any possible state transitions are displayed as edges.

As to the various types of codes, a convolutional code is generated by a linear shift-register circuit and performs a convolution operation on an information sequence, while a turbo code is generated by a parallel concatenation of two (or more) simple convolutional encoders that are separated by interleavers. Thus, along the lines of a turbo code, a concatenated code is established by cascading two codes separated by an interleaver. In a generator matrix, a K×N matrix produces a code word (of length N) of a block code by multiplying the information block of length K. The hamming distance is the number of bits in which two binary sequences of equal length differ. The minimum distance of a code is the smallest hamming distance between any pair of code words. The weight distribution is a list of the hamming distances of each code word from a given reference code word.

A Viterbi algorithm is an efficient method for decoding convolutional codes based on finding the path on a trellis diagram that is at a minimum distance from a receive sequence. Related to Viterbi coding is Maximum-Likelihood (ML) decoding that maximizes the probability of a receive sequence given any of the possible code words. If code words are equally likely, there could be a minimum possible error probability.

A convolutional code has been used in GSM and IS-95 systems. Its signal mapper consists of code word generators that define the addition and multiplication on the finite algebra. It is not efficient in comparison of its results to the Shannon limit. Its efficiency would be increased as the memory m increases. Both the computational complexity and memory storage for the Viterbi decoder will be doubled as m increases one. Thus, this approach is not feasible even for m=20. Turbo code, as noted before, is a further development of the convolutional code using parallel concatenation of two or more of the convolutional encoders and a pseudo-random interleaver.

Among the convolutional codes, some exhibit a characteristic behavior that is called catastrophic error propagation. For codes with this characteristic, (called catastrophic codes), it is possible for a finite number of reception errors to cause an infinite number of decoding errors. For time invariant convolutional codes, the definition and the ratio of catastrophic codes over total codes has been studied by those skilled in the art. For example, it is known that $1/(2^n-1)$ of all convolutional codes with the rate 1/n and a given constraint length are catastrophic. This analysis, however, may not be suitable for the time varying convolutional codes.

The present invention also considers the definition and properties of catastrophic codes for time varying convolutional codes. A new class of time varying convolutional codes can be obtained by periodically inserting symbols, e.g., zeros, into the information sequence and coding this expanded sequence by an ordinary convolutional code. This new code can be termed the "zero code." The term "catastrophic" can be changed to relate to the distance spectrum of the code. To apply this definition to time varying convolutional codes, the present invention provides a closed form to calculate the transfer function. This approach is related to the new definition of catastrophic codes as suggested by the present invention. The present invention also is operable for calculating the path enumerator for time varying convolutional codes.

In accordance with the present invention, it is thus possible to search for good convolutional codes among catastrophic codes. Thus, a large portion of the previously determined catastrophic codes can now be revived and used. For example, a previously known catastrophic encoder has enhanced performance after reviving the code by inserting zeros. This type of code has the free distance $d_{free}=8$ achieving the Heller and Griesmer bound for the constraint length K=5. In contrast, by exhaustive computer search, the best result was 7. The zero codes also have other advantages including reducing the computational complexity and the memory storage in half. The present invention can also provide for the definition of a catastrophic code based on distance spectrum, and calculate the path enumerator for both time invariant and time varying convolutional codes, while reviving a catastrophic code into an excellent convolutional zero code.

Typically, a convolutional code that may cause catastrophic error propagation has the following property: there exists an input sequence with infinite Hamming weights such that its corresponding code word generated by the encoder has a finite Hamming weight. If a code word generated by such encoders is sent through a noisy channel, a finite piece of distorted code word can cause a large number of wrong decoding decisions. As a first definition, convolutional code could be considered catastrophic if its corresponding state diagram contains a circuit in which a nonzero input sequence corresponds to an all-zero output sequence.

This definition, however, may not be suitable for time-varying codes because a same circuit may have different output at different times. Thus, as a second definition, a convolutional code could be considered catastrophic if its distance spectrum contains an infinite component that corresponds to a finite hamming weight. No matter how large a number M is, the present invention always can find paths with the same finite Hamming weight such that the total number of these paths is greater than M.

For time invariant catastrophic codes, these two definitions of a catastrophic code are equivalent with each other. If there is a circuit in which a non-zero input sequence corresponds to an all-zero output sequence, the starting and ending state can be "s." If a path, which starts and ends at the zero state and contains state "s," outputs a code word with a weight "h," it is possible to construct a new path with the same code word weight by going through the "s" circuit. It is possible, then, to construct infinitely many paths that output the same weight "h." Thus, the distance spectrum has an infinite component at the weight "h."

On the other hand, assuming the second definition for the term catastrophic holds, it is possible to prove that there must be a circuit satisfying the conditions in the first definition. According to the second definition described above, there exists infinitely many paths that output the code words with the same weight "h." Since there are finite distinct states, all possible combinations are finite. If in all these paths any state appeared less than "h" times, the total number of these paths would be bounded from above. Thus, there must be a path in which a system can find a state, e.g., $s_j$, appearing more than "h" times. Thus, at least one of the sub-paths, starting from $s_j$ and ending at $s_j$, has a corresponding code word with the hamming weight zero, and thus the second definition is applicable.

For this new "zero code," there are several distant sub-spectrums. As to the properties of a linear code, it is possible to assume that the information sequence is all-zero while the error bit is one. For the zero code, it is not known where the error bit is located. It is known, however, that the error bit cannot be at the position where a zero is inserted. The system considers (K–1) cases corresponding to different positions of the inserted zero against the error bit one. This leads to (K–1) different distance sub-spectrums for the zero code. When it is applied to the zero code, the distance spectrum in the second definition indicates the entire (K–1) sub-spectrums.

It is possible to use the path enumerator to fully describe the distance spectrum. The present invention is operable to calculate the path enumerator for both time invariant and time varying convolutional codes. Usually, the path enumerator for some trellis codes is obtained by solving a linear equation system. Another approach is operable for the zero code of the present invention.

It is possible to denote a state by a decimal number, whose binary expansion has the same form as it is in the shift register of the encoder. For a convolutional code with constraint length k=m+1 and code rate R=b/c:

$$s_{t,i} = \sum_{k=0}^{tc} \alpha_{t,i,k} D^k, i = 0, 1, \ldots, 2^m - 1$$

where $\alpha_{t,i,k}$ indicates the number of paths that start from the state 0 and end at the state i after exact t branches (steps, time units, etc.) and that have k hamming weights. These paths never pass through the state zero. For example, $s^{t,i}=5+4D+3D^2$ indicates that there are 12 paths starting from the state 0 and ending at the state i, while passing through t nodes, without the node 0,5, which corresponds to the all-zero code word, 4 of which associates with the hamming weight one, 3 of which associates with the hamming weight two. This representation allows the system to manipulate, by the same rule of polynomial multiplication and addition, the records of the number of paths and their corresponding code words hamming weights simultaneously.

Figure 1A:
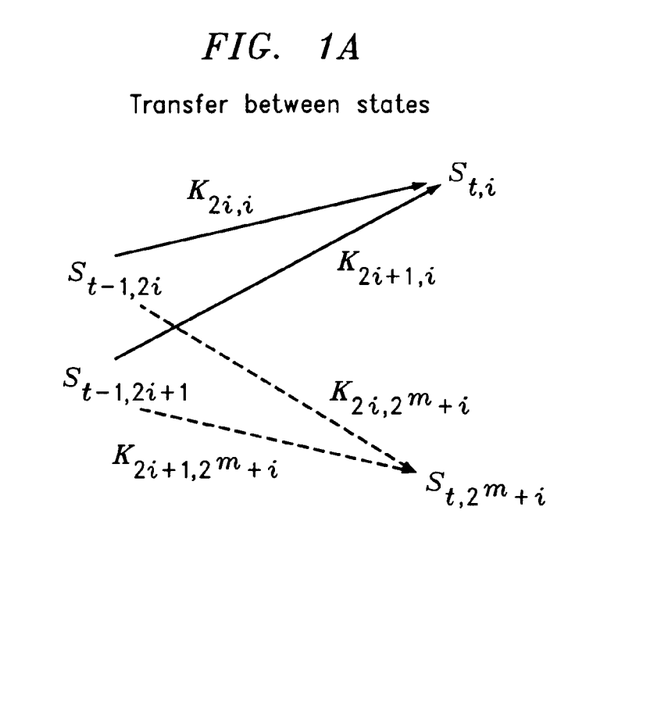
FIG. 1A shows the connections between states and consecutive layers in the trellis for a transfer between states in accordance with the present invention.
Figure 1B:
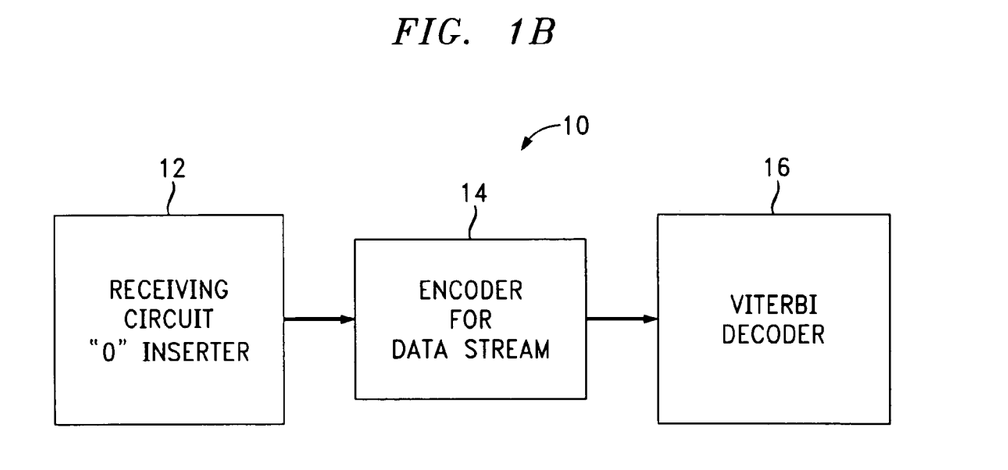
FIG. 1B is a block diagram showing the basic system for reviving a catastrophic code used for channel coding in data communications.

In FIG. 1A, the connections between states in the consecutive layers in the trellis are shown. The trellis is operable in a system 10 as shown in FIG. 1B, using a receiving circuit 12 that receives a digital input data sequence and is operative for periodically inserting known symbols, such as zeros. Then the expanded sequence of data is received in the encoder 14 for trellis encoding. The channel coded stream can be decoded such as by a Maximum Likelihood (ML) decoder, e.g., a Viterbi decoder 16. In one example, $k_{i,k}$ is the hamming weight gained on the path from the state i to the state j. Following the diagram of FIG. 1, it is shown as in FIG. 2.

Figure 2:
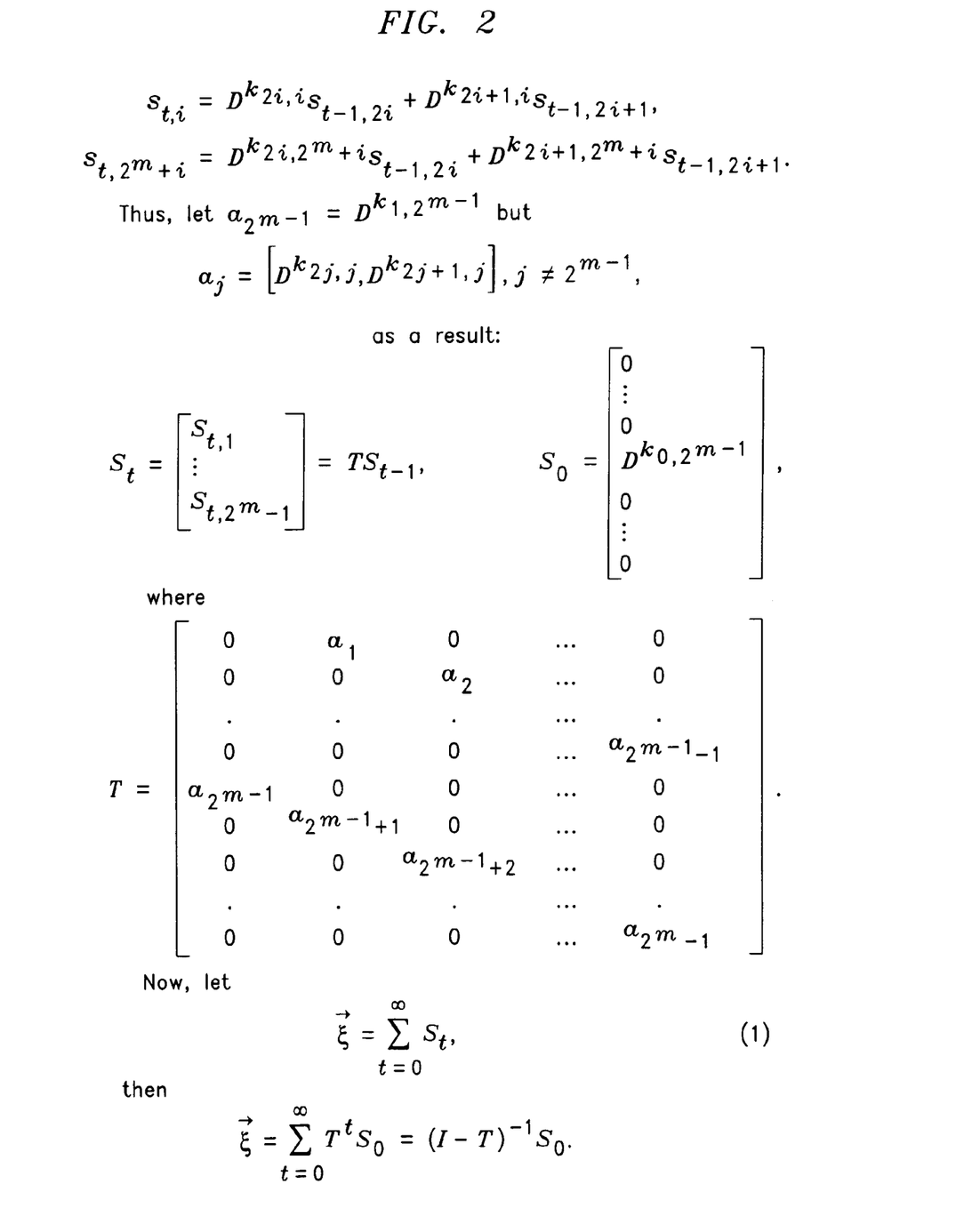
FIG. 2 are matrices and formulas showing a definition and manipulation for hamming weights gained on the path from state I to the state J as shown in FIG. 1.
Figure 3:
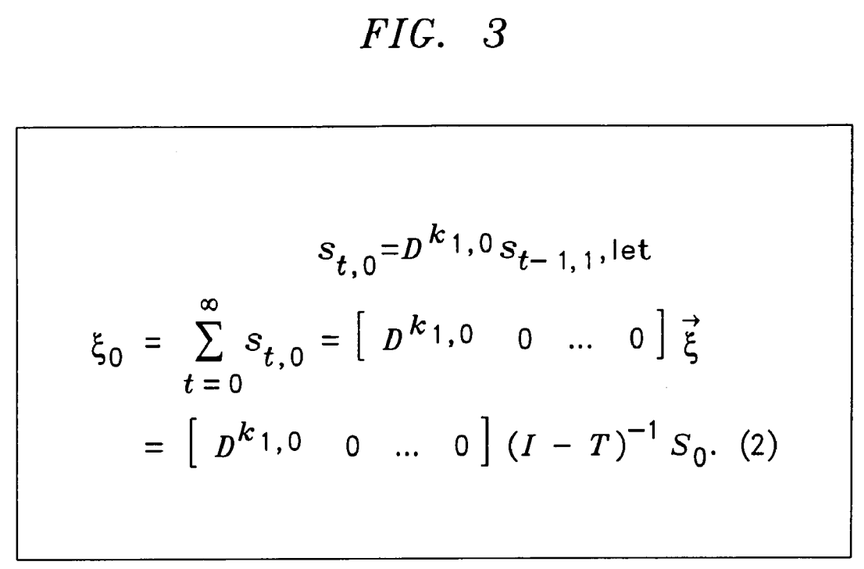
FIG. 3 are formulas for a Taylor expansion used for the coefficients as set forth in FIG. 2.

According to the above definition set forth in FIG. 2 and its manipulation, the i-th component in the vector $\vec{\xi}$, which is an infinite exponential series of D, presents all possible paths from the state 0 to the state i without passing the state 0 and the corresponding code words hamming weights. The preliminary formulation for the Taylor expansion is shown in FIG. 3. Thus, the coefficients of $D^k$ in the Taylor expansion of $\xi_0=\xi_0(D)$ represent the number of paths that start from the state $2^{m-1}$ and end at 0 while having the hamming weights k, i.e., the transfer function of the code.

For such an approach to be valid, it is necessary that the series (1) converges to $\xi_0(D)$ and (2) the Taylor expansion of $\xi_0(D)$ converges to $\xi_0(D)$. A sufficient condition for both of them is that all eigenvalues of the matrix T, which are functions of D, have the absolute values less than one in an interval, including zero, of D. Because these eigenvalues are continuous functions of D, if the numerical matrix $T(0)=T|_{D=0}$ has all its eigenvalues inside the unite circle, then the transfer function exists and the code must be non-catastrophic. The conditions (i) and (ii) are also necessary for calculating the path enumerator by solving a linear equation system.

Figure 4:
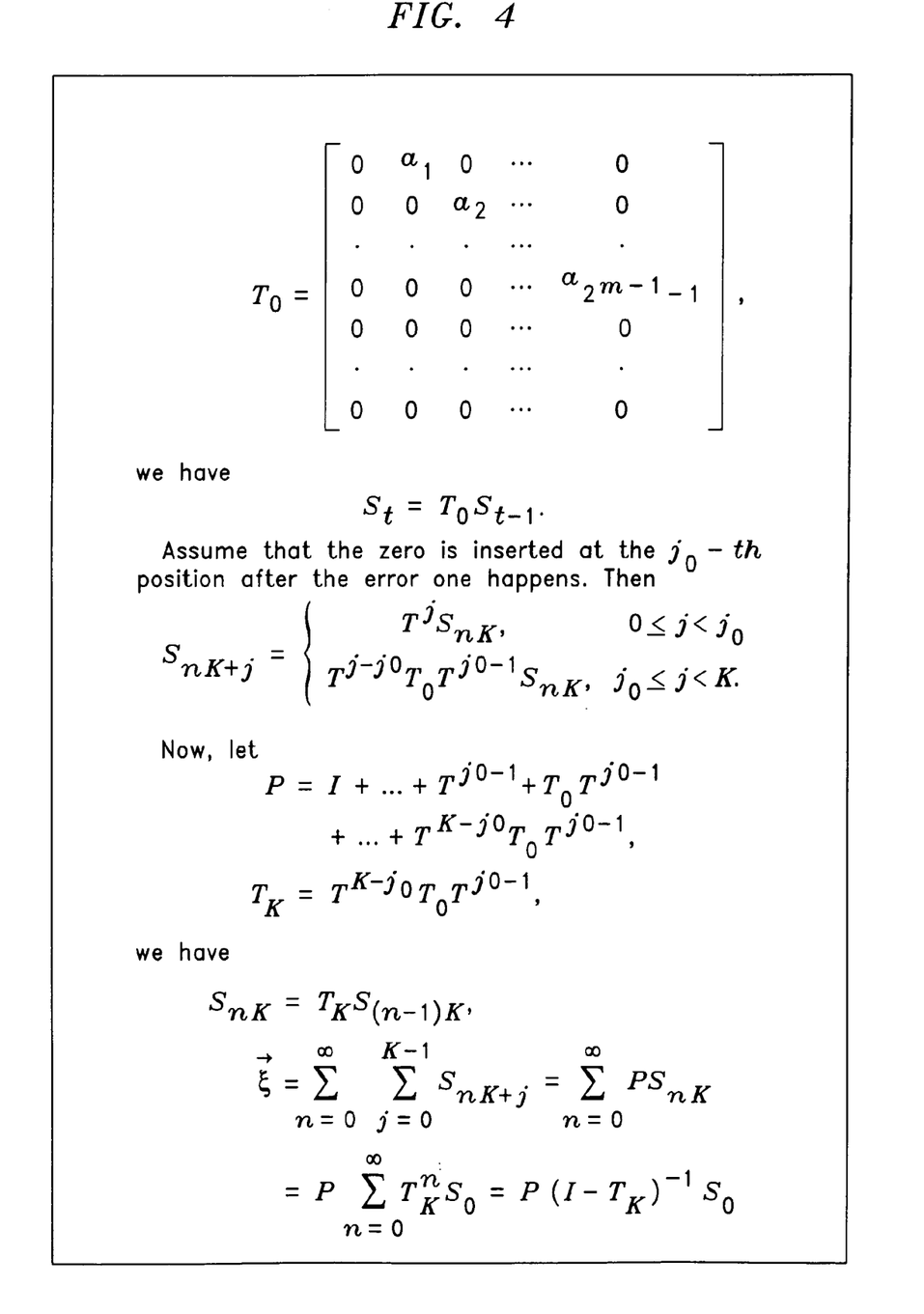
FIG. 4 is a matrix and formulas showing a transfer function for the zero code using inserted zeros, in accordance with the present invention.

When an inserted zero is input at the branch t, the dashed lines on FIG. 1 are cut off because these lines present a bit one as input. All transitions from the components in $S_{t-1}$ to the components $s_{t,j}$ with $j \geq 2^m$ disappear, while the transitions to $s_{t,j}$ with $j < 2^m$ remain the same. Thus, the same notations as in the previous subsection are used, but the values are placed in a table. The appropriate solution shows that the series converges, as shown in FIG. 4, which shows that the series converges. Thus, the transfer function for the zero code can be set forth:

$$\xi_0[D^{k-1},^0 0 \ldots 0]P(I-T_k)^{-1}S_0$$

Figure 5:
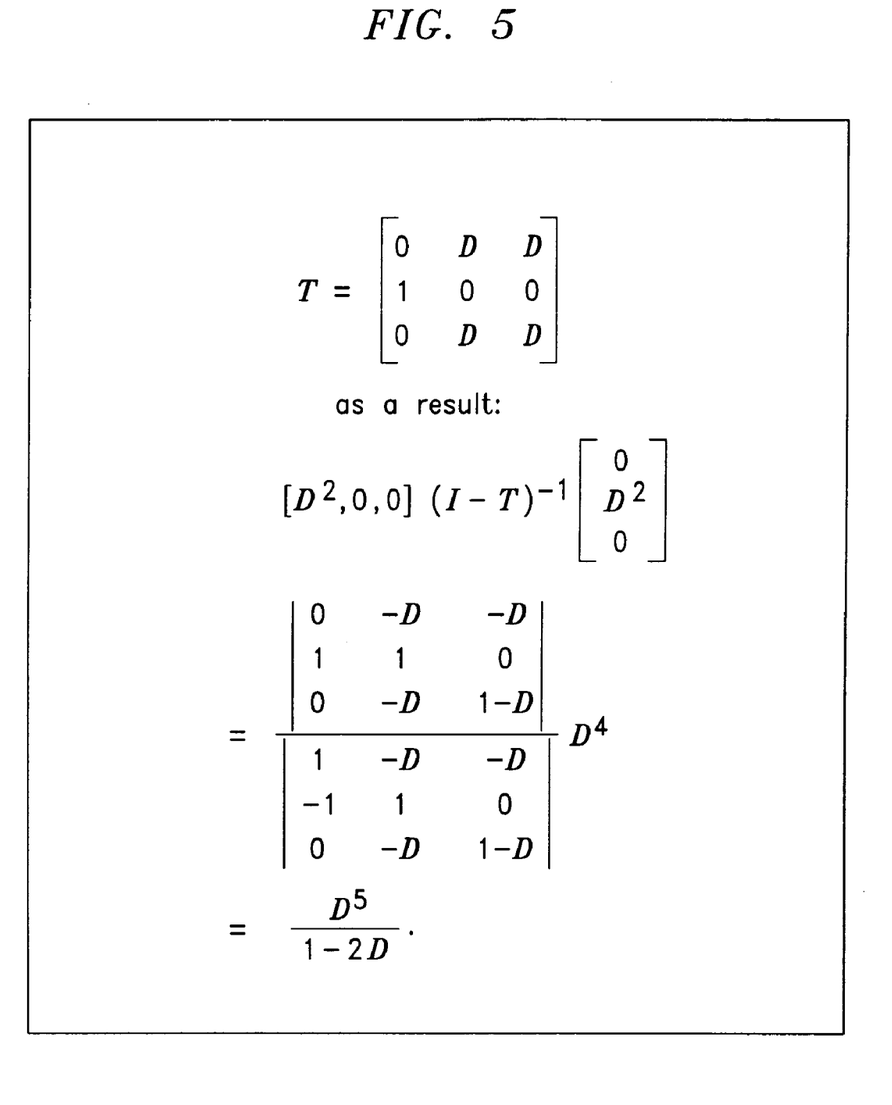
FIG. 5 is a matrix and formula for a time invariant convolutional code as an example of the transfer function.

If the numerical matrix $T_k(0)=T_k|_{D=0}$ has all eigenvalues inside the unit circle, the transfer function exists and the code is non-catastrophic. There are several examples for this transfer function as described. A first consideration is given to the widely studied time invariant convolutional code, where K=3, $g_1$=101 and $g_2$=111. This example is shown in the matrix and formulation of FIG. 5.

Figure 6:
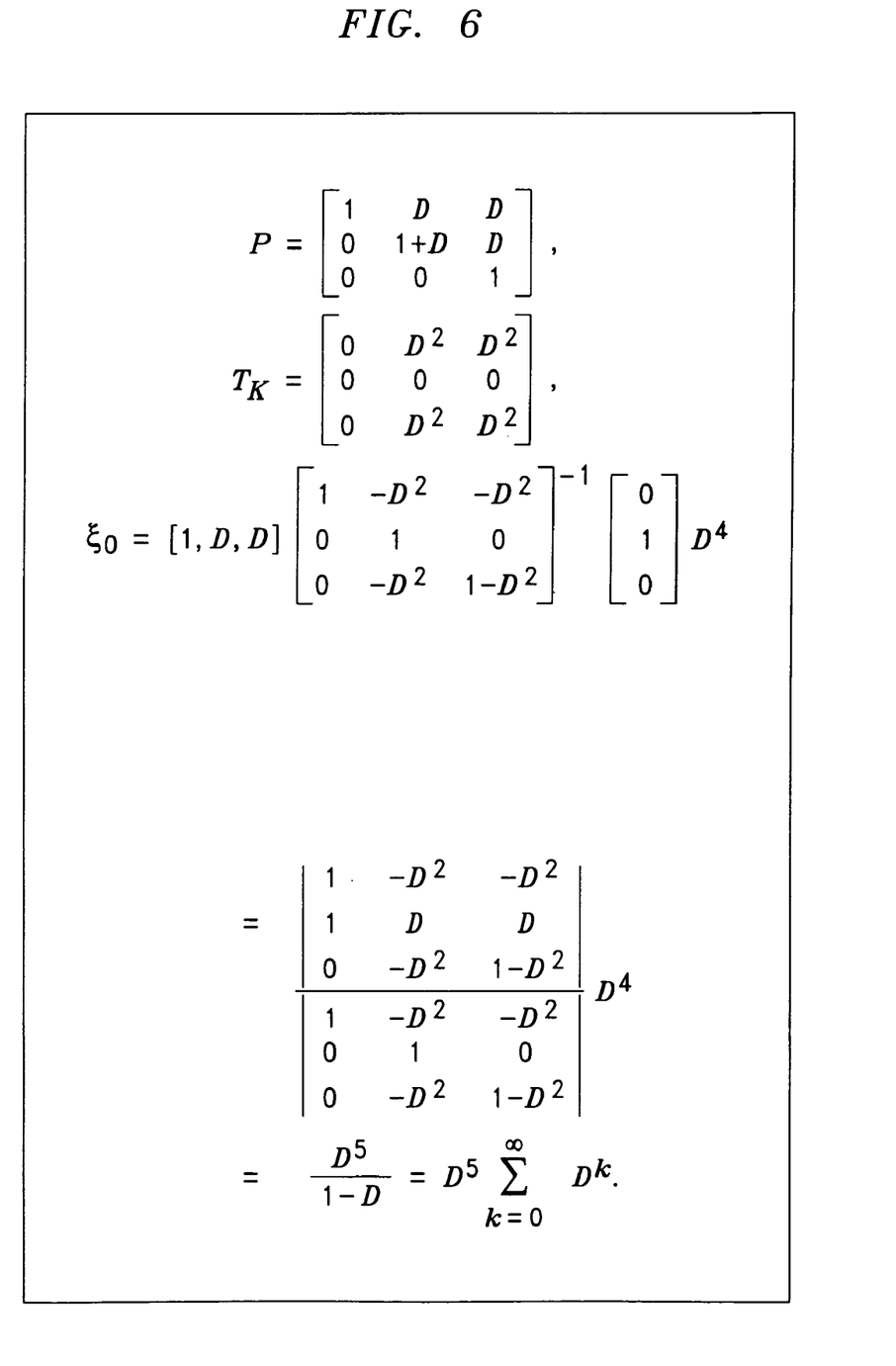
FIG. 6 shows the matrix and formula for inserting one zero after two information bits.

This formulation shown in FIG. 6 is the same as the solution by solving the linear equation system. The distance spectrum of this code is:

TABLE 1

| Hamming weights | 5 | 6 | 7 | 8 | 9 ... | 5 + n ... |
|---|---|---|---|---|---|---|
| Number of paths | 1 | 2 | 4 | 8 | 16 | $2^n$ ... |

It is possible to insert one zero after two information bits. If the zero is just following the first one, $j_0$=1, the resultant is shown as in the matrices of FIG. 6.

Figure 7:
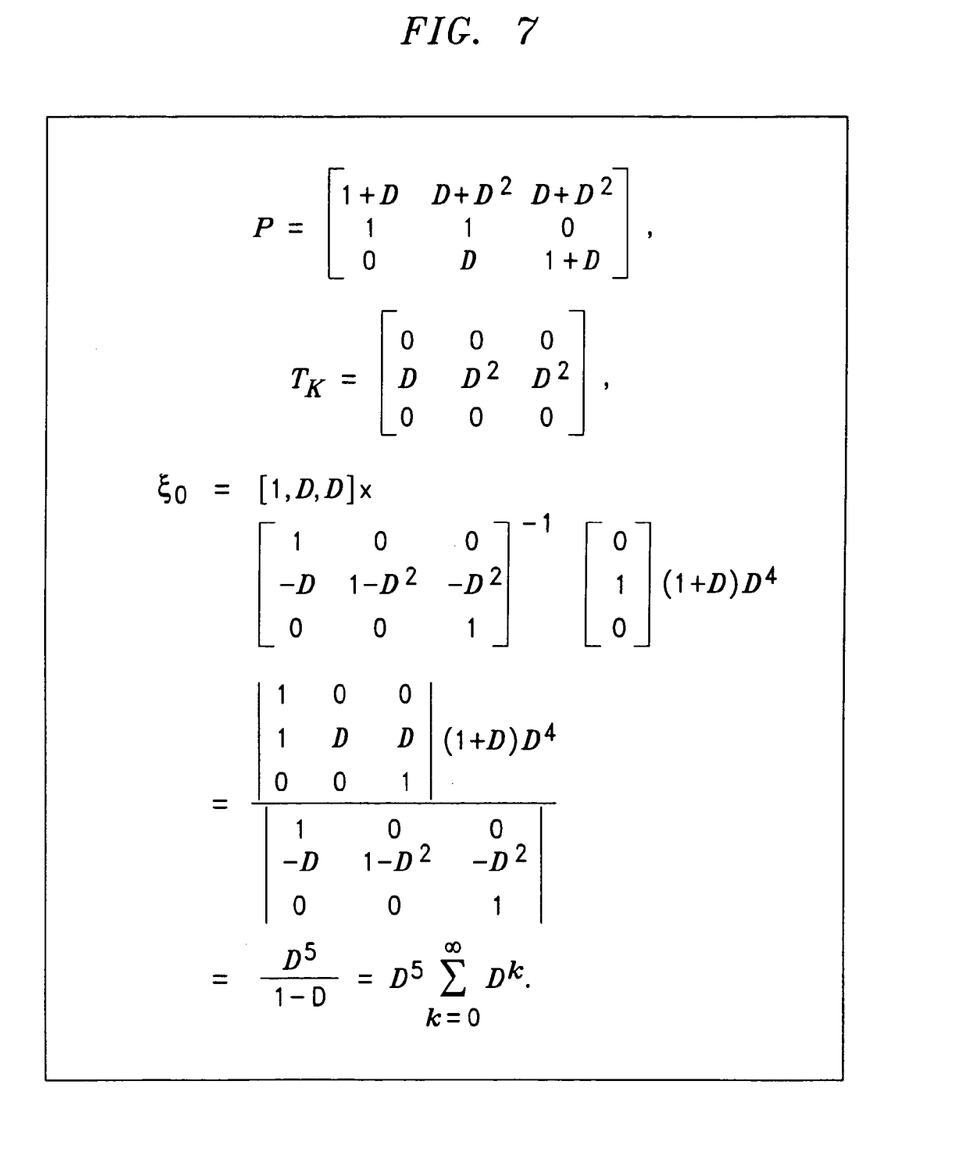
FIG. 7 are continued matrices and formulas for the transfer function calculation.

If the zero is at the second position, then $j_0$=2, and a result is shown in the matrices of FIG. 7.

In contrast to Table 1, after inserting zeros, it is possible to obtain:

TABLE 2

| Hamming weights | 5 | 6 | 7 | 8 | 9 ... | 5 + n ... |
|---|---|---|---|---|---|---|
| Number of paths | 1 | 1 | 1 | 1 | 1 ... | 1 ... |

There is an improvement for high hamming weight components in the distance spectrum. Of course, the system obtains this with the cost of reducing the code rate from ½ to ⅓.

In the topology of the trellis of a convolutional code, there are always circuits as is known to those skilled in the art. The shortest is the circuit 11 ... 11⇆ 11 ... 11. If each generator has an even hamming weight, the corresponding convolutional code is catastrophic. For the convolutional codes with code rate 1/n, the ratio of this kind of catastrophic code over the total codes is about $½^n$. Comparing the ratio $1/(2^n-1)$ given before, it is evident that most catastrophic codes belong in this category.

After inserting a zero periodically, the system changes the topology of the trellis. The circuit 11 ... 11⇆ 11 ... 11 will disappear, as thus the system can revive many of catastrophic codes.

An example is the convolutional code with K=5, $g_1$=10111 and $g_2$=11101 in binary. It is no doubt that this is a catastrophic code by the first definition set forth above. After inserting zeros periodically, this code has an excellent distance spectrum in comparison to all ordinary non-catastrophic codes with K=5 and R=½. In a computer search, the largest free distance for this kind of ordinary non-catastrophic codes is $d_{free}$=7, which is less the Heller and Griesmer bound 8.

If the system inserts zeros after each four information bits, this code is no longer catastrophic. It has the same $d_{free}$=8 for all four distance sub-spectrums. The numbers of the components corresponding to $d_{free}$ are 5, 3, 5 and 7 respectively, and the higher hamming weight components increase about 10 time after each lag 4. In Table 3, the distance spectrum of this zero code is compared to that of the optimal ordinary convolutional code with K=5, $g_1$=11001 and $g_2$=10111 (in binary). In this table, the first row presents hamming weights, the second row is the distance spectrum for the ordinary convolutional code, the third, fourth and fifth and sixth rows are the four distance sub-spectrums of the zero code.

TABLE 3

| 7 | 8 | 9 | 10 | 11 | 12 | 13 | 14 | 15 | 16 |
|---|---|---|---|---|---|---|---|---|---|
| 2 | 3 | 4 | 16 | 37 | 68 | 176 | 432 | 925 | 2156 |
| 0 | 5 | 0 | 0 | 0 | 49 | 0 | 0 | 0 | 490 |
| 0 | 3 | 0 | 0 | 0 | 31 | 0 | 0 | 0 | 313 |
| 0 | 5 | 0 | 0 | 0 | 50 | 0 | 0 | 0 | 504 |
| 0 | 7 | 0 | 0 | 0 | 69 | 0 | 0 | 0 | 691 |

From this table, the improvement is evident, however, the system has a smaller code rate R=4/10 =0.4 instead of R=0.5.

It is evident that the present invention revives catastrophic codes by periodically inserting known sequences, such as zeros, into the information sequence. Optional convolutional codes in previously catastrophic codes can now be determined and the path enumerators of both ordinary and zero inserted convolutional codes can be calculated.

This application is related to copending patent applications entitled, "ERROR CORRECTION TRELLIS CODING WITH PERIODICALLY INSERTED KNOWN SYMBOLS," which are filed on the same date and by the same assignee and inventors, the disclosures which are hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A system for reviving a code used for channel coding data in data communications systems comprising:
    a data receiving circuit for receiving a digital input data sequence to be coded with a code having a distance spectrum containing an infinite component that corresponds to a finite hamming weight such that the code may cause catastrophic error propagation, said circuit being operative for periodically inserting known symbols into the digital input data sequence; and
    an encoder operatively connected to said data receiving circuit for encoding the digital input data sequence with the code.

2. A system according to claim 1, wherein the known symbols that are inserted comprise zeros.

3. A system according to claim 1, wherein said encoder comprises a convolutional encoder.

4. A system according to claim 1, wherein said encoder is operative for trellis encoding the expanded digital input data sequence to produce a channel coded data stream such that the number of connections between trellis nodes in a trellis are reduced.

5. A system according to claim 4, wherein the trellis corresponds to a memory length m, and the known symbols are inserted after each m symbol within the input data sequence.

6. A method of reviving a code used for channel coding data in a data communications systems comprising the steps of:
    receiving a digital input data sequence to be coded with a code having a distance spectrum containing an infinite component that corresponds to a finite hamming weight such that the code may cause catastrophic error propagation;

periodically inserting known symbols into the digital input data sequence; and encoding the digital input data sequence with the code.

7. A method according to claim 6, wherein the step of inserting known symbols comprises the step of inserting zeros into the digital input data sequence.

8. A method according to claim 7, and further comprising the step of inserting a zero after each of two information bits within the digital input data sequence.

9. A method according to claim 7, and further comprising the step of inserting a zero after each of four information bits within the digital input data sequence.

10. A method according to claim 6, wherein the code for encoding the digital input data sequence comprises a convolutional code.

11. A method according to claim 10, wherein the convolutional code comprises a time varying convolutional code.

12. A method according to claim 10, wherein the convolutional code comprises a time invariant convolutional code such that a corresponding state diagram contains a circuit in which a nonzero input sequence corresponds to an all-zero output sequence.

13. A method according to claim 6, and further comprising the step of trellis encoding the digital input data sequence after inserting the known symbols to produce a channel coded data stream.

14. A method according to claim 13, wherein the topology of the trellis corresponds to a memory length m, and further comprising the step of inserting a known symbol after each m symbol within the digital input data sequence.

15. A method of reviving a code used for channel coding data in a data communications systems comprising the steps of:

receiving a digital input data sequence to be coded with a code having a distance spectrum containing an infinite component that corresponds to a finite hamming weight such that the code may cause catastrophic error propagation;

periodically inserting known symbols into the digital input data sequence; and trellis encoding the digital input data sequence after inserting the known symbols to produce a channel coded data stream such that the number of connections between trellis nodes in a trellis are reduced.

16. A method according to claim 15, wherein the topology of the trellis corresponds to a memory length m, and further comprising the step of inserting a known symbol after each m symbol within the digital input data sequence.

17. A method according to claim 15, and further comprising the step of applying code words that are one-to-one mappings of distinct paths on a trellis to binary sequences.

18. A method according to claim 15, wherein the step of inserting known symbols comprises the step of inserting zeros into the digital input data sequence.

19. A method according to claim 15, and further comprising the step of inserting a zero after each of two information bits within the digital input data sequence.

20. A method according to claim 15, and further comprising the step of inserting a zero after each of four information bits within the digital input data sequence.

21. A method according to claim 15, wherein the code for encoding the digital input data sequence comprises a convolutional code.

22. A method according to claim 21, wherein the code comprises a time varying convolutional code.

23. A method according to claim 21, wherein the code comprises a time invariant convolutional code such that a corresponding state diagram contains a circuit in which a nonzero input sequence corresponds to an all-zero output sequence.

* * * * *